United States Patent
Li et al.

(10) Patent No.: US 10,243,009 B2
(45) Date of Patent: Mar. 26, 2019

(54) ARRAY SUBSTRATE, METHOD FOR FORMING ARRAY SUBSTRATE, DISPLAY PANEL AND DISPLAY DEVICE

(71) Applicants: BOE TECHNOLOGY GROUP CO., LTD., Beijing (CN); CHONGQING BOE OPTOELECTRONICS TECHNOLOGY CO., LTD., Chongqing (CN)

(72) Inventors: Yunze Li, Beijing (CN); Ni Yang, Beijing (CN); Shaoru Li, Beijing (CN); Zhijian Qi, Beijing (CN)

(73) Assignees: BOE TECHNOLOGY GROUP CO., LTD. (CN); CHONGQING BOE OPTOELECTRONICS TECHNOLOGY CO., LTD. (CN)

( * ) Notice: Subject to any disclaimer, the term of this patent is extended or adjusted under 35 U.S.C. 154(b) by 0 days.

(21) Appl. No.: 15/678,868

(22) Filed: Aug. 16, 2017

(65) Prior Publication Data
US 2018/0151592 A1    May 31, 2018

(30) Foreign Application Priority Data
Nov. 30, 2016  (CN) .......................... 2016 1 1082836

(51) Int. Cl.
*H01L 27/12* (2006.01)
*H01L 21/31* (2006.01)
*H01L 21/768* (2006.01)

(52) U.S. Cl.
CPC ............ *H01L 27/124* (2013.01); *H01L 21/31* (2013.01); *H01L 21/76801* (2013.01); *H01L 21/76819* (2013.01); *H01L 27/1262* (2013.01)

(58) Field of Classification Search
CPC ..... H01L 27/124; H01L 27/1262; H01L 21/31; H01L 21/76801; H01L 21/76819
See application file for complete search history.

(56) References Cited

U.S. PATENT DOCUMENTS

| 2002/0179901 | A1* | 12/2002 | Arai ..................... H01L 51/0002 257/40 |
| 2004/0152291 | A1 | 8/2004 | Do |
| 2010/0140614 | A1* | 6/2010 | Uchiyama ......... H01L 21/28291 257/43 |

(Continued)

FOREIGN PATENT DOCUMENTS

| CN | 103855085 A | 6/2014 |
| CN | 106057827 A | 10/2016 |

(Continued)

OTHER PUBLICATIONS

First Office Action for Chinese Application No. 201611082836.6, dated Nov. 1, 2018, 8 pages.

*Primary Examiner* — Fei Fei Yeung Lopez
(74) *Attorney, Agent, or Firm* — Brooks Kushman P.C.

(57) ABSTRACT

An array substrate, a method for forming an array substrate, a display panel and a display device are provided, which relate to the field of display technology. The array substrate includes a functional film layer pattern on a base substrate and an insulating layer covering the functional film layer pattern, and a segment difference of a surface of the insulating layer is smaller than a segment difference threshold.

14 Claims, 5 Drawing Sheets

(56) References Cited

U.S. PATENT DOCUMENTS

| | | | |
|---|---|---|---|
| 2011/0101339 A1* | 5/2011 | Yamazaki | G11C 11/405 257/43 |
| 2014/0145310 A1* | 5/2014 | Akiyama | H01L 27/1266 257/618 |
| 2014/0183635 A1 | 7/2014 | Kim | |
| 2016/0043116 A1* | 2/2016 | Sun | H01L 21/28008 257/43 |

FOREIGN PATENT DOCUMENTS

| | | |
|---|---|---|
| JP | 2010027869 A | 2/2010 |
| WO | WO2015043302 * | 4/2015 |

* cited by examiner

ARRAY SUBSTRATE, METHOD FOR FORMING ARRAY SUBSTRATE, DISPLAY PANEL AND DISPLAY DEVICE

CROSS-REFERENCE TO RELATED APPLICATION

This application claims priority to Chinese Patent Application No. 201611082836.6 filed on Nov. 30, 2016, which is incorporated herein by reference in its entirety.

TECHNICAL FIELD

The present disclosure relates to the field of display technology, and in particular to an array substrate, a method for forming an array substrate, a display panel and a display device.

BACKGROUND

In an industry of thin film transistor-liquid crystal display (TFT-LCD), a method for manufacturing an array substrate in the related art includes: forming in sequence a gate electrode, an insulating layer, an active layer, a source-drain electrode and a protection layer.

Functional patterns such as the gate electrode, the active layer and the source-drain electrode are especially arranged at the portion of the array substrate with the TFT, and thus there may be relatively large segment difference. Due to the relatively large segment difference, a coating of an alignment film and a liquid crystal extension in the subsequent process may be adversely affected, and a Rubbing weak region may be formed during a Rubbing process (i.e., a rubbing process for forming the alignment film), which may adversely affect the display and result in a picture ghosting, a light leak and a decrease of the production yield.

SUMMARY

An objective of the present disclosure is to reduce the segment difference in the layers of the of the array substrate in the related art.

In one aspect, 1. an array substrate is provided in at least one embodiment of the present disclosure, including a functional film layer pattern on a base substrate and an insulating layer covering the functional film layer pattern, where a segment difference of a surface of the insulating layer is smaller than a segment difference threshold.

Optionally, the functional film layer pattern includes a gate metallic layer pattern, and the insulating layer includes a gate insulating layer covering the gate metallic layer pattern; and the array substrate further includes a first sacrificial layer, where the gate metallic layer pattern is embedded in the first sacrificial layer, and a surface of the gate metallic layer pattern is in flush with a surface of the first sacrificial layer.

Optionally, the functional film layer pattern includes a source-drain metallic layer pattern, and the insulating layer includes a passivation layer covering the source-drain metallic layer pattern; and the array substrate further includes a second sacrificial layer, where an active layer of the array substrate is embedded in the second sacrificial layer, a surface of the active layer is arranged at a plane identical to a surface of the second sacrificial layer, and the source-drain metallic layer pattern is arranged on the plane.

Optionally, the second sacrificial layer is a gate insulating layer, and the active layer is embedded in the gate insulating layer and does not penetrate through the gate insulating layer.

Optionally, the functional film layer pattern includes a source-drain metallic layer pattern and an active layer, and the insulating layer includes a gate insulating layer covering the source-drain metallic layer pattern and the active layer; and the array substrate further includes a third sacrificial layer, where the source-drain metallic layer pattern and the active layer of the array substrate is embedded in the third sacrificial layer, and a surface of the active layer is in flush with a surface of the third sacrificial layer.

Optionally, the functional film layer pattern further includes a gate metallic layer pattern in the gate insulating layer and does not penetrate through the gate insulating layer, and a surface of the gate metallic layer pattern is in flush with a surface of the gate insulating layer.

Optionally, the functional film layer pattern further includes a source-drain metallic layer pattern, and the insulating layer includes a passivation layer covering the source-drain metallic layer pattern; and the array substrate further includes a fourth sacrificial layer, where the source-drain metallic layer pattern of the array substrate is embedded in the fourth sacrificial layer, a surface of the source-drain metallic layer pattern is arranged at a plane identical to a surface of the fourth sacrificial layer, and the gate insulating layer is arranged between the source-drain metallic layer pattern and the gate metallic layer pattern.

Optionally, the functional film layer pattern further includes an active layer on the gate insulating layer, and the array substrate further includes a fifth sacrificial layer, where the active layer of the array substrate is embedded in the fifth sacrificial layer, a surface of the active layer is in flush with a surface of the fifth sacrificial layer, and the active layer is in contact with the source-drain metallic layer pattern and arranged between the source-drain metallic layer pattern and the gate insulating layer.

Optionally, the fifth sacrificial layer is the gate insulating layer, and the source-drain metallic layer pattern is embedded in the gate insulating layer and does not penetrate through the gate insulating layer.

Optionally, the first sacrificial layer is provided with an upper surface and a lower surface, and the gate metallic layer pattern is provided with an upper surface and a lower surface, where the upper surface of the gate metallic layer pattern is arranged at a plane identical to the upper surface of the first sacrificial layer, and the lower surface of the gate metallic layer pattern is arranged at a plane identical to the lower surface of the first sacrificial layer; and a thickness of the first sacrificial layer is identical a thickness of the gate metallic layer pattern.

Optionally, the second sacrificial layer is provided with an upper surface and a lower surface, and the active layer is provided with an upper surface and a lower surface, where the upper surface of the active layer is arranged at a plane identical to the upper surface of the second sacrificial layer, and the lower surface of the active layer is arranged at a plane identical to the lower surface of the second sacrificial layer; a thickness of the second sacrificial layer is identical a thickness of the active layer; and the source-drain metallic layer pattern is arranged on the upper surface of the active layer.

Optionally, the array substrate further includes an active layer, where the functional film layer pattern further includes a source-drain metallic layer pattern, and the insulating layer includes a gate insulating layer and a passivation layer covering the source-drain metallic layer pattern; the gate insulating layer is provided with an upper surface and a lower surface, and the active layer is provided with an upper surface and a lower surface, where the upper surface of the active layer is arranged at a plane identical to the upper surface of the gate insulating layer, and the source-drain metallic layer pattern is arranged on the upper surface of the active layer.

Optionally, the third sacrificial layer is provided with an upper surface and a lower surface, and the active layer is provided with an upper surface and a lower surface, and the source-drain metallic layer pattern is provided with an upper surface and a lower surface, where the upper surface of the active layer is arranged at a plane identical to the upper surface of the third sacrificial layer, and the lower surface of the source-drain metallic layer pattern is arranged at a plane identical to the lower surface of the third sacrificial layer; and a thickness of the third sacrificial layer is equal to a sum of a thickness of the active layer and a thickness of the source-drain metallic layer pattern.

Optionally, the gate metallic layer pattern is provided with an upper surface and a lower surface, and the gate insulating layer is provided with an upper surface and a lower surface, where the upper surface of the gate metallic layer pattern is arranged at a plane identical to the upper surface of the gate insulating layer.

Optionally, the fourth sacrificial layer is provided with an upper surface and a lower surface, and the source-drain metallic layer pattern is provided with an upper surface and a lower surface, where the upper surface of the source-drain metallic layer pattern is arranged at a plane identical to the upper surface of the fourth sacrificial layer, and the lower surface of the source-drain metallic layer pattern is arranged at a plane identical to the lower surface of the fourth sacrificial layer; and a thickness of the source-drain metallic layer pattern is identical a thickness of the fourth sacrificial layer.

In another aspect, a method for forming an array substrate is further provided in at least one embodiment of the present disclosure, including: forming a functional film layer pattern on a base substrate and an insulating layer covering the functional film layer pattern, where a segment difference of a surface of the insulating layer is smaller than a segment difference threshold.

Optionally, the insulating layer includes a sacrificial layer, and the forming the functional film layer pattern on the base substrate and the insulating layer covering the functional film layer pattern includes: forming the sacrificial layer on the base substrate; etching the sacrificial layer to form a gap in the sacrificial layer; and forming the functional film layer pattern in the gap of the sacrificial layer, where a surface of the functional film layer pattern is in flush with a surface of the sacrificial layer.

In addition, a display panel including the above array substrate is further provided in at least one embodiment of the present disclosure.

In addition, a display device including the above display panel is further provided in at least one embodiment of the present disclosure.

DETAILED DESCRIPTION

In order to make the technical issues, the technical solutions and the advantages of the present disclosure more apparent, the present disclosure will be described hereinafter in a clear and complete manner in conjunction with the drawings and embodiments.

In view of the relatively large segment difference of the layer structure of the array substrate in the related art, the present disclosure provides the following solutions.

Figure 1:
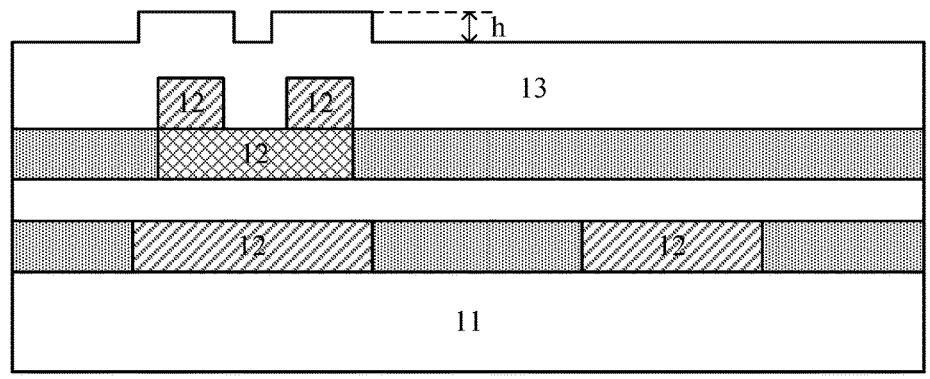
FIG. 1 is a schematic view of an array substrate in at least one embodiment of the present disclosure.

In one aspect, an array substrate is provided in at least one embodiment of the present disclosure. As shown in FIG. 1, the array substrate includes a functional film layer pattern 12 on a base substrate 11 and an insulating layer 13 covering the functional film layer pattern 12, where a segment difference h of a surface of the insulating layer 13 is smaller than a segment difference threshold.

According to the array substrate in at least one embodiment of the present disclosure, the segment difference of the surface of the insulating layer is smaller than the segment difference threshold, therefore the surface of the array substrate may be smoother. During coating the alignment film in the subsequent process, the alignment film may not be broken and the rubbing weak region may not be formed in the case that the segment difference of the surface of the array substrate is small, thereby solving the ghosting and light leak of the display image caused by an abnormal rotation of liquid crystals.

The array substrate in at least one embodiment of the present disclosure will be described in details hereinafter.

Figure 2A:
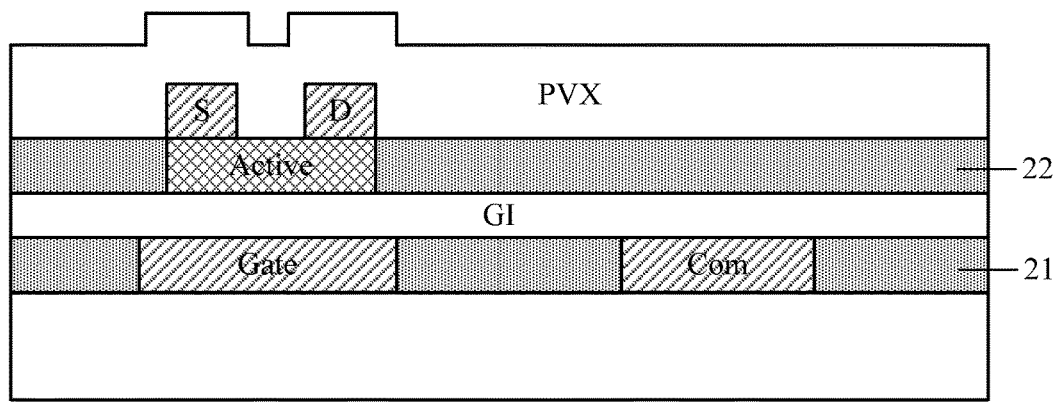
FIG. 2A to FIG. 4B are schematic views of an array substrate in at least one embodiment of the present disclosure.

As shown in FIG. 2A, the functional film layer pattern includes a gate metallic layer pattern. The gate metallic layer pattern includes a gate electrode and a common electrode line, and the insulating layer includes a gate insulating layer covering the gate metallic layer pattern.

In at least one embodiment of the present disclosure, the array substrate further includes a first sacrificial layer 21. The gate metallic layer pattern (the gate electrode and the common electrode line) is embedded into the first sacrificial layer 21, and a surface of the gate metallic layer pattern is in flush with a surface of the first sacrificial layer 21.

According to the array substrate in at least one embodiment of the present disclosure, it is able to reduce effectively the segment difference of the entire layer structure caused by the gate metallic layer pattern.

In addition, in at least one embodiment of the present disclosure, the functional film layer pattern may further include a source-drain metallic layer pattern. The source-drain metallic layer pattern mainly includes a source electrode S and a drain electrode D. In at least one embodiment of the present disclosure, the insulating layer further includes a passivation layer PVX covering the source-drain metallic layer pattern.

Correspondingly, the array substrate further includes a second sacrificial layer 22 and an active layer. The active layer is embedded into the second sacrificial layer 22, a surface of the active layer is in flush with a surface of the second sacrificial layer 22, and the source-drain metallic layer pattern (the source electrode S and the drain electrode D) is on the surface of the second sacrificial layer 22.

As shown in FIG. 2A, in at least one embodiment of the present disclosure, the first sacrificial layer 21 is provided with an upper surface and a lower surface, and the gate metallic layer pattern is provided with an upper surface and a lower surface. The upper surface of the gate metallic layer pattern is in flush with the upper surface of the first sacrificial layer 21, and the lower surface of the gate metallic layer pattern is in flush with the lower surface of the first sacrificial layer 21. A thickness of the first sacrificial layer 21 is identical a thickness of the gate metallic layer pattern.

Optionally, the second sacrificial layer 22 is provided with an upper surface and a lower surface, and the active layer is provided with an upper surface and a lower surface. The upper surface of the active layer is in flush with the upper surface of the second sacrificial layer 22, and the lower surface of the active layer is in flush with the lower surface of the second sacrificial layer 22. A thickness of the second sacrificial layer 22 is identical a thickness of the active layer, and the source-drain metallic layer pattern is on the upper surface of the active layer.

It can be seen from FIG. 2A, according to the array substrate in at least one embodiment of the present disclosure, a segment difference of the surface of the passivation layer is merely the thickness of the source-drain metallic layer pattern (the source electrode S and the drain electrode D), so the segment difference is reduced significantly in compare with the related art.

Optionally, in at least one embodiment of the present disclosure, the gate insulating layer may further be used as the second sacrificial layer 22. That is, the structure shown in FIG. 2B does not have the second sacrificial layer 22, the active layer is embedded into the gate insulating layer but does not penetrate through the gate insulating layer, and a surface of the active layer is in flush with a surface of the gate insulating layer.

Figure 2B:
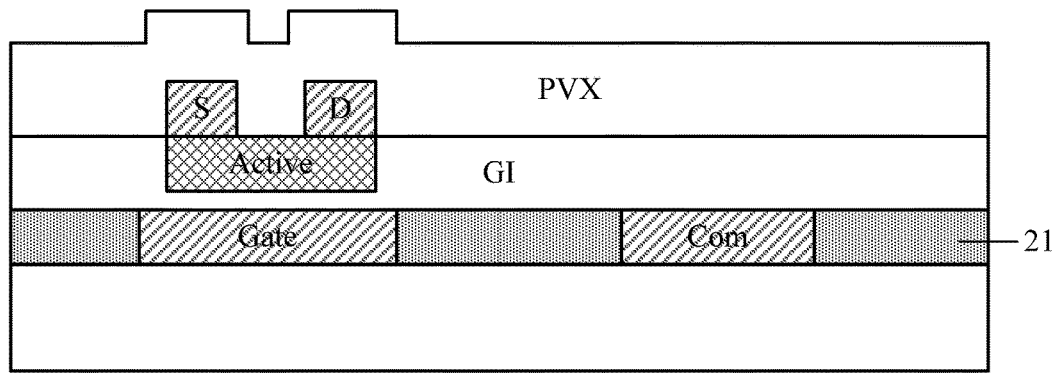

As shown in FIG. 2B, in at least one embodiment of the present disclosure, the upper surface of the active layer is in flush with the upper surface of the gate insulating layer, and the source-drain metallic layer pattern is on the upper surface of the active layer.

According to the array substrate in at least one embodiment of the present disclosure, a layer quantity of the array substrate may be reduced, thereby simplifying the process of forming the array substrate and the structure of the array substrate.

Figure 3:
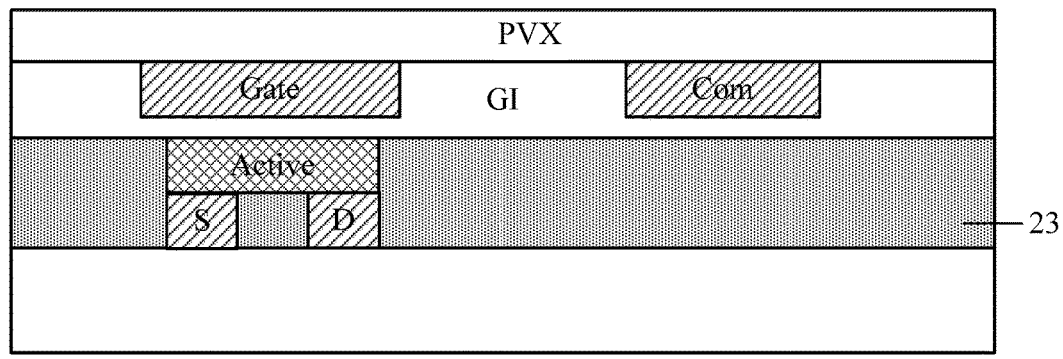

As shown in FIG. 3, the functional film layer pattern includes the source-drain metallic layer pattern (the source electrode S and the drain electrode D) and the active layer, and the insulating layer includes the gate insulating layer covering the source-drain metallic layer pattern and the active layer.

In at least one embodiment of the present disclosure, the array substrate further includes a third sacrificial layer 23. The source-drain metallic layer pattern (the source electrode S and the drain electrode D) and the active layer are embedded into the third sacrificial layer 23, and a surface of the active layer is in flush with a surface of the third sacrificial layer.

It can be seen that, according to the array substrate in at least one embodiment of the present disclosure, the segment difference of the surface of the array substrate caused by the source-drain metallic layer pattern (the source electrode S and the drain electrode D) and the active layer may be removed completely.

Optionally, in at least one embodiment of the present disclosure, the functional film layer pattern further the gate metallic layer pattern (the gate electrode and the common electrode line) and the gate insulating layer. The gate metallic layer pattern is embedded into the gate insulating layer but does not penetrate through the gate insulating layer, and a surface of the gate metallic layer pattern is in flush with a surface of the gate insulating layer.

As shown in FIG. 3, in at least one embodiment of the present disclosure, the third sacrificial layer 23 is provided with an upper surface and a lower surface, and the active layer is provided with an upper surface and a lower surface, and the source-drain metallic layer pattern is provided with an upper surface and a lower surface. The upper surface of the active layer is in flush with the upper surface of the third sacrificial layer 23, and the lower surface of the source-drain metallic layer pattern is in flush with the lower surface of the third sacrificial layer 23. A thickness of the third sacrificial layer 23 is equal to a sum of a thickness of the active layer and a thickness of the source-drain metallic layer pattern.

As shown in FIG. 3, in at least one embodiment of the present disclosure, the gate metallic layer pattern is provided with an upper surface and a lower surface, and the gate insulating layer is provided with an upper surface and a lower surface. The upper surface of the gate metallic layer pattern is in flush with the upper surface of the gate insulating layer.

It can be seen from FIG. 3, according to the array substrate in at least one embodiment of the present disclosure, there is almost not any segment difference at the region where the TFT is arranged.

In at least one embodiment of the present disclosure, the functional film layer pattern includes the gate metallic layer pattern (e.g., the gate electrode and the common electrode line), and the insulating layer includes the gate insulating layer covering the gate metallic layer pattern.

Figure 4A:
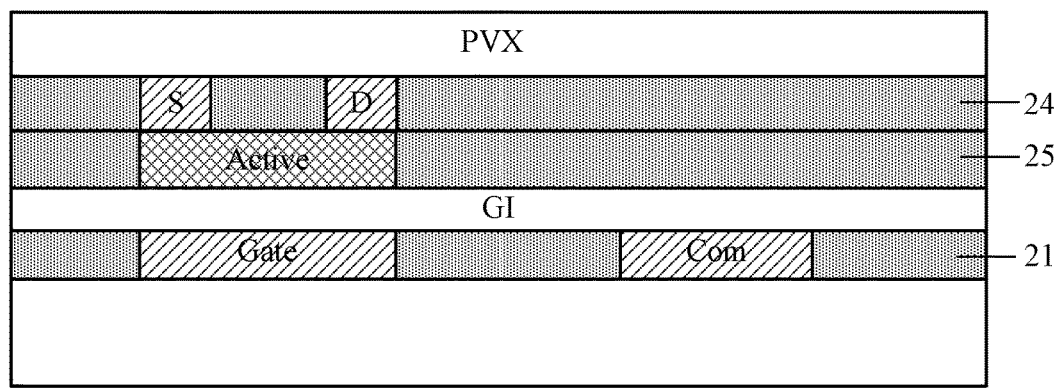

Optionally, as shown in FIG. 4A, the array substrate in at least one embodiment of the present disclosure further includes the first sacrificial layer 21. The gate metallic layer pattern (e.g., the gate electrode and the common electrode line) is embedded into the first sacrificial layer 21, and a surface of the gate metallic layer pattern is in flush with a surface of the first sacrificial layer 21.

According to the array substrate in at least one embodiment of the present disclosure, it is able to remove the segment difference of the entire layer structure caused by the gate metallic layer pattern.

Optionally, in at least one embodiment of the present disclosure, the functional film layer pattern further includes a source-drain metallic layer pattern, and the insulating layer includes a passivation layer covering the source-drain metallic layer pattern. The array substrate further includes a fourth sacrificial layer 24. The source-drain metallic layer pattern is embedded into the fourth sacrificial layer 24, a surface of the source-drain metallic layer pattern is in flush with a surface of the fourth sacrificial layer 24, and the gate insulating layer is between the source-drain metallic layer pattern and the gate metallic layer pattern.

In at least one embodiment of the present disclosure, as shown in FIG. 4A, the fourth sacrificial layer 24 is provided with an upper surface and a lower surface, and the source-drain metallic layer pattern is provided with an upper surface and a lower surface. The upper surface of the source-drain metallic layer pattern is in flush with the upper surface of the fourth sacrificial layer 24, and the lower surface of the source-drain metallic layer pattern is in flush with the lower surface of the fourth sacrificial layer 24. A thickness of the source-drain metallic layer pattern is identical a thickness of the fourth sacrificial layer 24.

In addition, in at least one embodiment of the present disclosure, the functional film layer pattern further includes the active layer on the gate insulating layer, and the array substrate further includes a fifth sacrificial layer 25. The active layer is embedded into the fifth sacrificial layer 25, a surface of the active layer is in flush with a surface of the fifth sacrificial layer 25, and the active layer is in contact with the source-drain metallic layer pattern and arranged between the source-drain metallic layer pattern and the gate insulating layer.

It can be seen from FIG. 4A, according to the array substrate in at least one embodiment of the present disclosure, there is almost not any segment difference at the region where the TFT is arranged.

Figure 4B:
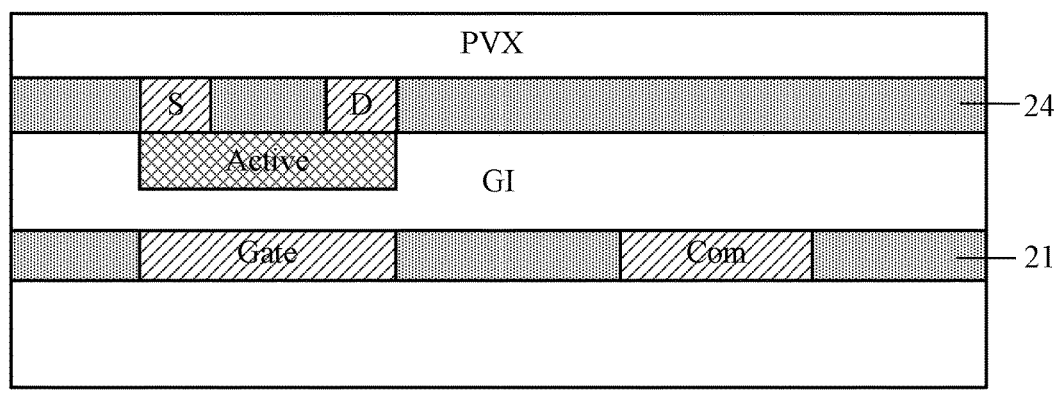

Optionally, in at least one embodiment of the present disclosure, the gate insulating layer may further be used as the fifth sacrificial layer 25. That is, the structure shown in FIG. 4B does not have the fifth sacrificial layer 25, the active layer is embedded into the gate insulating layer but does not penetrate through the gate insulating layer, and a surface of the active layer is in flush with a surface of the gate insulating layer.

The above is merely to describe the array substrate in at least one embodiment of the present disclosure, and the technical solution in which the functional film layer pattern is embedded into the sacrificial layer and a surface of the functional film layer pattern is arranged in flush with a surface of the sacrificial layer may also fall into the scope of the present disclosure.

In another aspect, the present disclosure provides in at least one embodiment a method for forming an array substrate. The method includes forming a functional film layer pattern on a base substrate and an insulating layer covering the functional film layer pattern, where a segment difference of a surface of the insulating layer is smaller than a segment difference threshold.

According to the method for forming the array substrate in at least one embodiment of the present disclosure, the segment difference of the surface of the insulating layer is smaller than the segment difference threshold, therefore the surface of the array substrate may be smoother. During coating the alignment film in the subsequent process, the alignment film may not be broken and the rubbing weak region may not be formed in the case that the segment difference of the surface of the array substrate is small, thereby solving the ghosting and light leak of the display image caused by an abnormal rotation of liquid crystals.

Figure 5A:
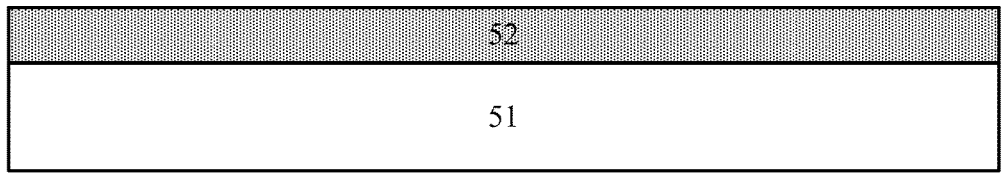
FIG. 5A to FIG. 5C show a flow chart of a method for forming an array substrate in at least one embodiment of the present disclosure.
Figure 5B:
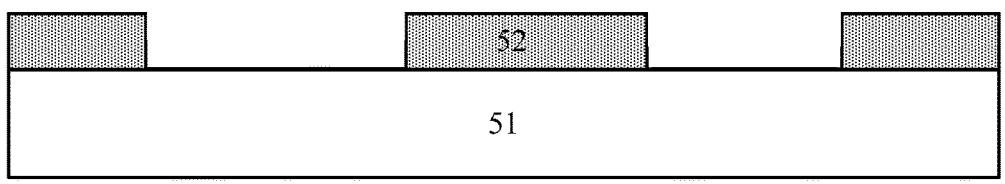
Figure 5C:
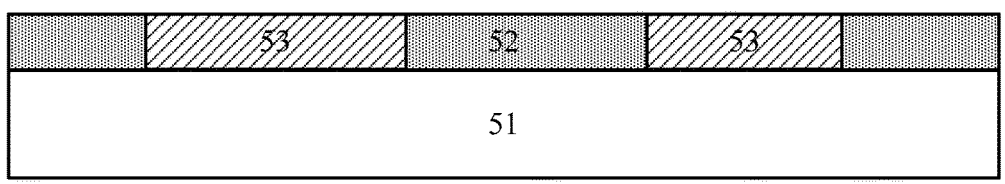

To be specific, in at least one embodiment of the present disclosure, the insulating layer includes a sacrificial layer, and the forming the functional film layer pattern on the base substrate and the insulating layer covering the functional film layer pattern includes:

Step 1: forming the sacrificial layer 52 on the base substrate 51, as shown in FIG. 5A;

Step 2: etching the sacrificial layer 52 to form a gap in the sacrificial layer 52, as shown in FIG. 5B; and Step 3: forming the functional film layer pattern 53 in the gap of the sacrificial layer 52, where a surface of the functional film layer pattern 53 is in flush with a surface of the sacrificial layer 52, as shown in FIG. 5C.

It can be seen from the above Step 1 to Step 3, according to the method for forming the array substrate in at least one embodiment of the present disclosure, the segment difference of the surface of the functional film layer pattern may be removed, and the sacrificial layer may protect the functional film layer pattern during the cleaning of the formed functional film layer pattern, so as to prevent the functional film layer pattern from falling off from the array substrate.

In at least one embodiment of the present disclosure, the sacrificial layer 52 may be made of a material which is corrosion-resistant and insulative and has a high transmittance and a reliable performance, such as SiNx, and a thickness of the sacrificial layer 52 is not smaller than that of the functional film layer pattern 53. In addition, the method of depositing the sacrificial layer 52 and etching the same to from the gap is not limited in the present disclosure. For example, the sacrificial layer 52 may be formed by a process of coating vertically, instilling, ink-jet printing and cutting, and the gap may be formed by a process of solution instilling and plasma bombardment.

The method for forming the array substrate in at least one embodiment of the present disclosure will be described hereinafter.

Figure 6A:
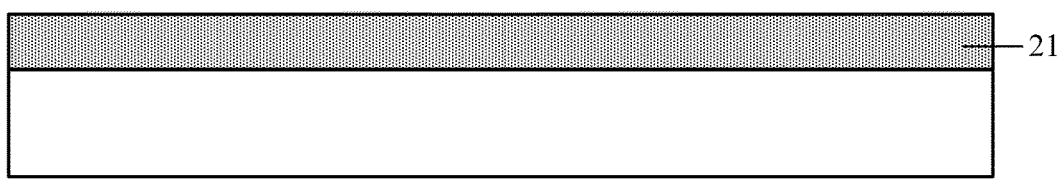
FIG. 6A to FIG. 6H show a flow chart of a method for forming the array substrate shown in FIG. 2 in at least one embodiment of the present disclosure.
Figure 6B:
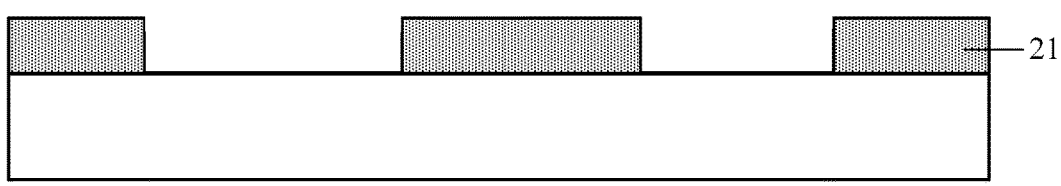
Figure 6C:
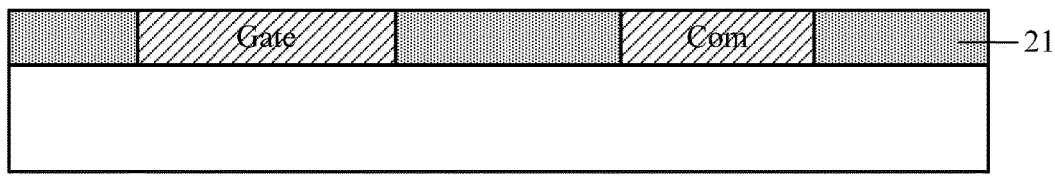

The method for forming the array substrate shown in FIG. 2 in at least one embodiment of the present disclosure includes:

Step 61: forming the first sacrificial layer 21 on the base substrate, as shown in FIG. 6A;

Step 62: etching the first sacrificial layer 21 to form a gap corresponding to the gate metallic layer pattern including the gate electrode and the common electrode line, as shown in FIG. 6B; and Step 63: depositing a gate metallic layer material into the gap in the first sacrificial layer 21 to form the gate electrode and the common electrode line, as shown in FIG. 6C.

For example, in Step 63, firstly a photoresist protection layer may be formed at a portion of the first sacrificial layer 21 other than the gap, and then the gate metallic layer material may be deposited into the gap in the first sacrificial layer 21 by a vacuum evaporation process or an electron beam evaporation process. The photoresist may be removed after depositing the gate metallic layer material.

Optionally, in Step 63, firstly a high-strength protection layer may be formed at a portion of the first sacrificial layer 21 other than the gap, and then the gate metallic layer material may be sputtered into the gap in the first sacrificial layer 21. The sputtering of the gate metallic layer material may include: sputtering the gate metallic layer material slowly so as not to break the formed layers; after sputtering a certain amount of gate metallic layer material, sputtering the gate metallic layer material faster so as to form the gate metallic layer pattern quickly; and peeling off the protection layer after the gate metallic layer pattern is formed.

Figure 6D:
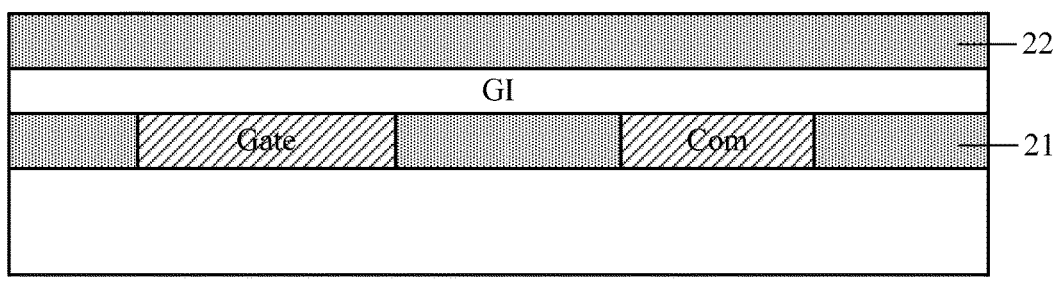
Figure 6E:
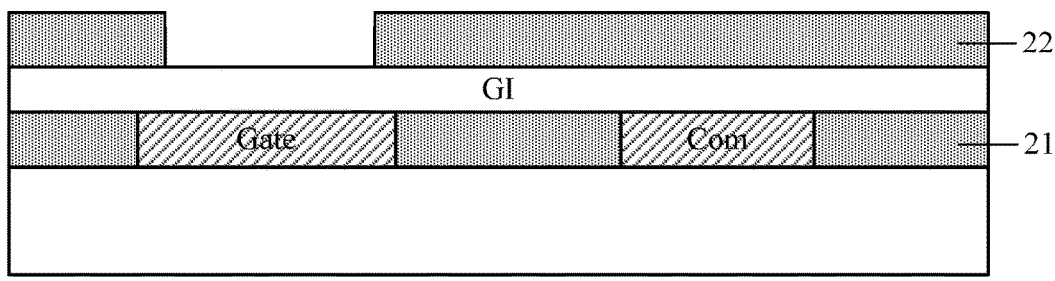
Figure 6F:
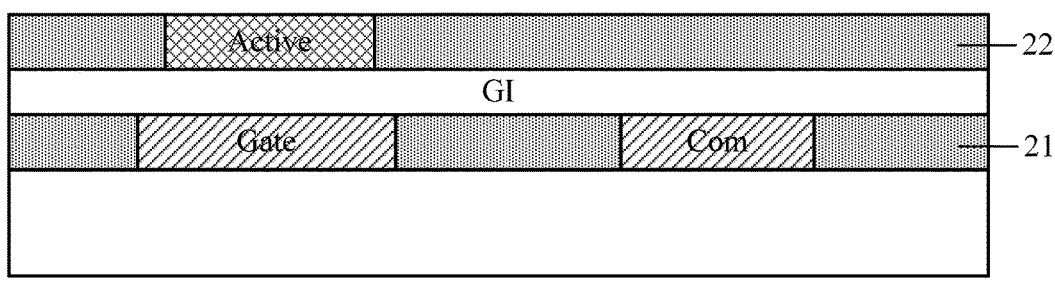
Figure 6G:
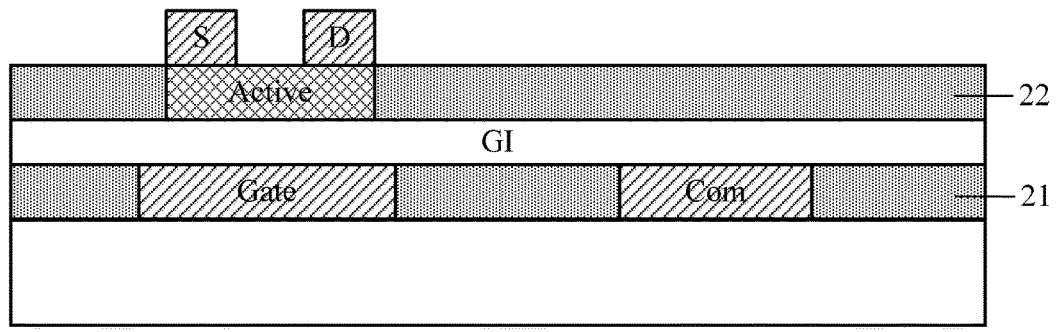
Figure 6H:
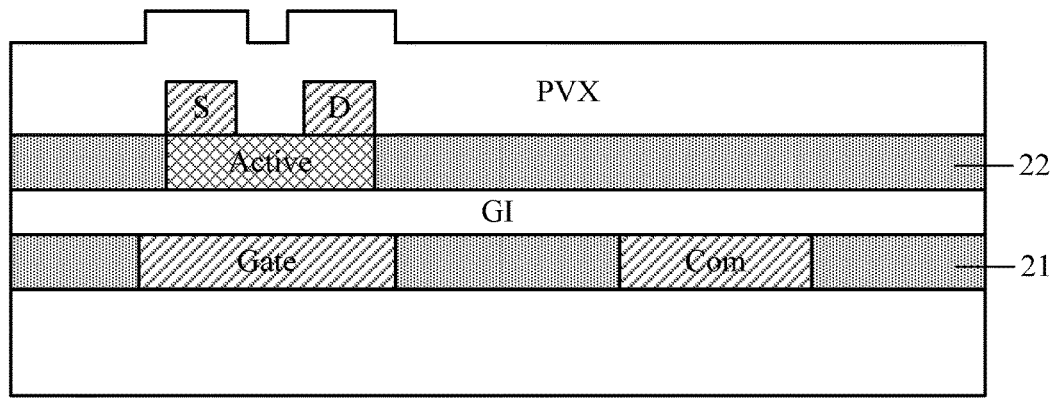

Step 64: forming the gate insulating layer and the second sacrificial layer 22, as shown in FIG. 6D. In Step 64, only the gate insulating layer may be formed in the case that the gate insulating layer is further used as the second sacrificial layer 22;

Step 65: etching the second sacrificial layer 22 to form a gap therein corresponding to a shape of the active layer, as shown in FIG. 6E;

Step 66: depositing a semiconductive material into the gap in the second sacrificial layer 22, so as to form the active layer, as shown in FIG. 6F;

Step 67: forming the source-drain metallic layer pattern including the source electrode S and the drain electrode D on the second sacrificial layer 22, as shown in FIG. 6G; and Step 68: depositing the passivation layer, as shown in FIG. 6H.

The above are some embodiments of the method for forming the array substrate. In addition, the array substrates shown in FIG. 3 and FIG. 4 respectively may also be formed by the above method.

Moreover, the present disclosure provides in at least one embodiment a display panel and a display device, where the display panel includes the above array substrate, and the display device includes the above display panel. According to the display panel and the display device, the ghosting and light leak of the display image caused by the coating of the alignment film may be solved.

The above are merely some embodiments of the present disclosure. A person skilled in the art may make further modifications and improvements without departing from the principle of the present disclosure, and these modifications and improvements shall also fall within the scope of the present disclosure.

What is claimed is:

1. An array substrate, comprising:
a functional film layer pattern on a base substrate and an insulating layer covering the functional film layer pattern, wherein a segment difference of a surface of the insulating layer is smaller than a threshold,
wherein the functional film layer pattern comprises a gate metallic layer pattern, a source-drain metallic layer pattern and an active layer, the insulating layer comprises a gate insulating layer covering the gate metallic layer pattern and a passivation layer covering the source-drain metallic layer pattern;
the array substrate further comprises a first sacrificial layer and a second sacrificial layer;
the gate metallic layer pattern is embedded in the first sacrificial layer, and a surface of the gate metallic layer pattern is in flush with a surface of the first sacrificial layer; and
the active layer is embedded in the second sacrificial layer, an upper surface of the active layer and an upper surface of the second sacrificial layer are both arranged at a first plane, and a lower surface of the active layer and a lower surface of the second sacrificial layer are both arranged at a second plane; and the source-drain metallic layer pattern is formed on the first plane.

2. An array substrate, comprising:
a functional film layer pattern on a base substrate and an insulating layer covering the functional film layer pattern, wherein a segment difference of a surface of the insulating layer is smaller than a threshold, wherein the functional film layer pattern comprises a source-drain metallic layer pattern and an active layer, and the insulating layer comprises a gate insulating layer covering the source-drain metallic layer pattern and the active layer; and
the array substrate further comprises a third sacrificial layer, wherein the source-drain metallic layer pattern and the active layer of the array substrate are embedded in the third sacrificial layer, and a surface of the active layer is in flush with an upper surface of the third sacrificial layer.

3. The array substrate according to claim 2, wherein the functional film layer pattern further comprises a gate metallic layer pattern in the gate insulating layer and does not penetrate through the gate insulating layer, and a surface of the gate metallic layer pattern is in flush with a surface of the gate insulating layer.

4. The array substrate according to claim 1, further comprising a fourth sacrificial layer, wherein the source-drain metallic layer pattern of the array substrate is embedded in the fourth sacrificial layer, a surface of the source-drain metallic layer pattern is arranged at a plane identical to a surface of the fourth sacrificial layer, and the gate insulating layer is arranged between the source-drain metallic layer pattern and the gate metallic layer pattern.

5. The array substrate according to claim 4, wherein the active layer is in contact with the source-drain metallic layer pattern and arranged between the source-drain metallic layer pattern and the gate insulating layer.

6. The array substrate according to claim 1, wherein the first sacrificial layer is provided with an upper surface and a lower surface, and the gate metallic layer pattern is provided with an upper surface and a lower surface, wherein
the upper surface of the gate metallic layer pattern is arranged at a plane identical to the upper surface of the first sacrificial layer, and the lower surface of the gate metallic layer pattern is arranged at a plane identical to the lower surface of the first sacrificial layer; and
a thickness of the first sacrificial layer is identical a thickness of the gate metallic layer pattern.

7. The array substrate according to claim 1, wherein the second sacrificial layer is provided with an upper surface and a lower surface, and the active layer is provided with an upper surface and a lower surface, wherein
the upper surface of the active layer is arranged at a plane identical to the upper surface of the second sacrificial layer, and the lower surface of the active layer is arranged at a plane identical to the lower surface of the second sacrificial layer;
a thickness of the second sacrificial layer is identical a thickness of the active layer; and
the source-drain metallic layer pattern is arranged on the upper surface of the active layer.

8. The array substrate according to claim 2, wherein the third sacrificial layer is provided with an upper surface and a lower surface, and the active layer is provided with an upper surface and a lower surface, and the source-drain metallic layer pattern is provided with an upper surface and a lower surface, wherein
the upper surface of the active layer is arranged at a plane identical to the upper surface of the third sacrificial layer, and the lower surface of the source-drain metallic layer pattern is arranged at a plane identical to the lower surface of the third sacrificial layer; and
a thickness of the third sacrificial layer is equal to a sum of a thickness of the active layer and a thickness of the source-drain metallic layer pattern.

9. The array substrate according to claim 3, wherein the gate metallic layer pattern is provided with an upper surface and a lower surface, and the gate insulating layer is provided with an upper surface and a lower surface, wherein the upper surface of the gate metallic layer pattern is arranged at a plane identical to the upper surface of the gate insulating layer.

10. The array substrate according to claim 4, wherein the fourth sacrificial layer is provided with an upper surface and a lower surface, and the source-drain metallic layer pattern is provided with an upper surface and a lower surface, wherein
the upper surface of the source-drain metallic layer pattern is arranged at a plane identical to the upper surface of the fourth sacrificial layer, and the lower surface of the source-drain metallic layer pattern is arranged at a plane identical to the lower surface of the fourth sacrificial layer; and
a thickness of the source-drain metallic layer pattern is identical a thickness of the fourth sacrificial layer.

11. A method for forming the array substrate according to claim 2, comprising:

forming the functional film layer pattern on the base substrate and the insulating layer covering the functional film layer pattern so that the segment difference of the surface of the insulating layer is smaller than the threshold.

12. The method according to claim 11, wherein the insulating layer comprises a sacrificial layer, and the forming the functional film layer pattern on the base substrate and the insulating layer covering the functional film layer pattern comprises:

forming the sacrificial layer on the base substrate;

etching the sacrificial layer to form a gap in the sacrificial layer; and forming the functional film layer pattern in the gap of the sacrificial layer, wherein a surface of the functional film layer pattern is in flush with a surface of the sacrificial layer.

13. A display panel comprising the array substrate according to claim 1.

14. A display device comprising the display panel according to claim 13.

* * * * *